US012696667B1

(12) United States Patent
Chhabra et al.

(10) Patent No.: US 12,696,667 B1
(45) Date of Patent: Jul. 28, 2026

(54) MANUFACTURING DISPLAYS WITH AN ENCAPSULATION LAYER

(71) Applicant: Apple Inc., Cupertino, CA (US)

(72) Inventors: Mahendra Chhabra, Los Gatos, CA (US); Peng Xu, Santa Clara, CA (US); Alejandro X Levander, El Granada, CA (US); Bhadrinarayana Lalgudi Visweswaran, San Mateo, CA (US); Jitsuo Ota, Kawasaki (JP); Tae Woon Cha, Santa Clara, CA (US); Zhibing Ge, Sunnyvale, CA (US); Hannah Elmaraghi, San Diego, CA (US); Junhwan Lim, San Jose, CA (US)

(73) Assignee: Apple Inc., Cupertino, CA (US)

( * ) Notice: Subject to any disclaimer, the term of this patent is extended or adjusted under 35 U.S.C. 154(b) by 477 days.

(21) Appl. No.: 18/341,501

(22) Filed: Jun. 26, 2023

Related U.S. Application Data

(60) Provisional application No. 63/403,448, filed on Sep. 2, 2022.

(51) Int. Cl.
 *H10K 59/80* (2023.01)
 *H10K 59/38* (2023.01)
 *H10K 71/13* (2023.01)

(52) U.S. Cl.
 CPC .......... *H10K 59/873* (2023.02); *H10K 59/38* (2023.02); *H10K 59/8793* (2023.02); *H10K 71/135* (2023.02)

(58) Field of Classification Search
 CPC ........................ H10K 59/873; H10K 59/8793
 See application file for complete search history.

(56) References Cited

U.S. PATENT DOCUMENTS

| | | | |
|---|---|---|---|
| 7,560,747 B2 | 7/2009 | Cok | |
| 7,816,856 B2 | 10/2010 | Cok et al. | |
| 8,324,804 B2 * | 12/2012 | Kim ................... | H10K 59/8791 |
| | | | 313/506 |
| 8,529,990 B2 | 9/2013 | Fedorovskaya et al. | |
| 9,773,994 B2 | 9/2017 | Kim | |
| 2009/0278454 A1 | 11/2009 | Fedorovskaya et al. | |
| 2022/0102674 A1 | 3/2022 | Wang et al. | |

FOREIGN PATENT DOCUMENTS

| | | | | |
|---|---|---|---|---|
| EP | 4024490 A1 * | 7/2022 | ........... | H10K 59/873 |

* cited by examiner

*Primary Examiner* — Joseph L Williams
(74) *Attorney, Agent, or Firm* — Treyz Law Group, P.C.; Joseph F. Guihan; Jinie M. Guihan

(57) ABSTRACT

A display may include a substrate, an array of pixels formed on the substrate, at least one encapsulation layer that is formed over the array of pixels, a color filter layer that is formed over the at least one encapsulation layer, and an additional encapsulation layer that is formed on the color filter layer. The at least one encapsulation layer may include a first encapsulation layer formed using chemical vapor deposition (CVD) and second and third encapsulation layers formed using atomic layer deposition (ALD). The additional encapsulation layer may include an inorganic material and may be formed using chemical vapor deposition. The additional encapsulation layer and the first encapsulation layer may both be formed from the same material.

31 Claims, 9 Drawing Sheets

ELECTRONIC DEVICE — 10

CONTROL CIRCUITRY — 16

INPUT-OUTPUT DEVICES — 12

DISPLAY — 14

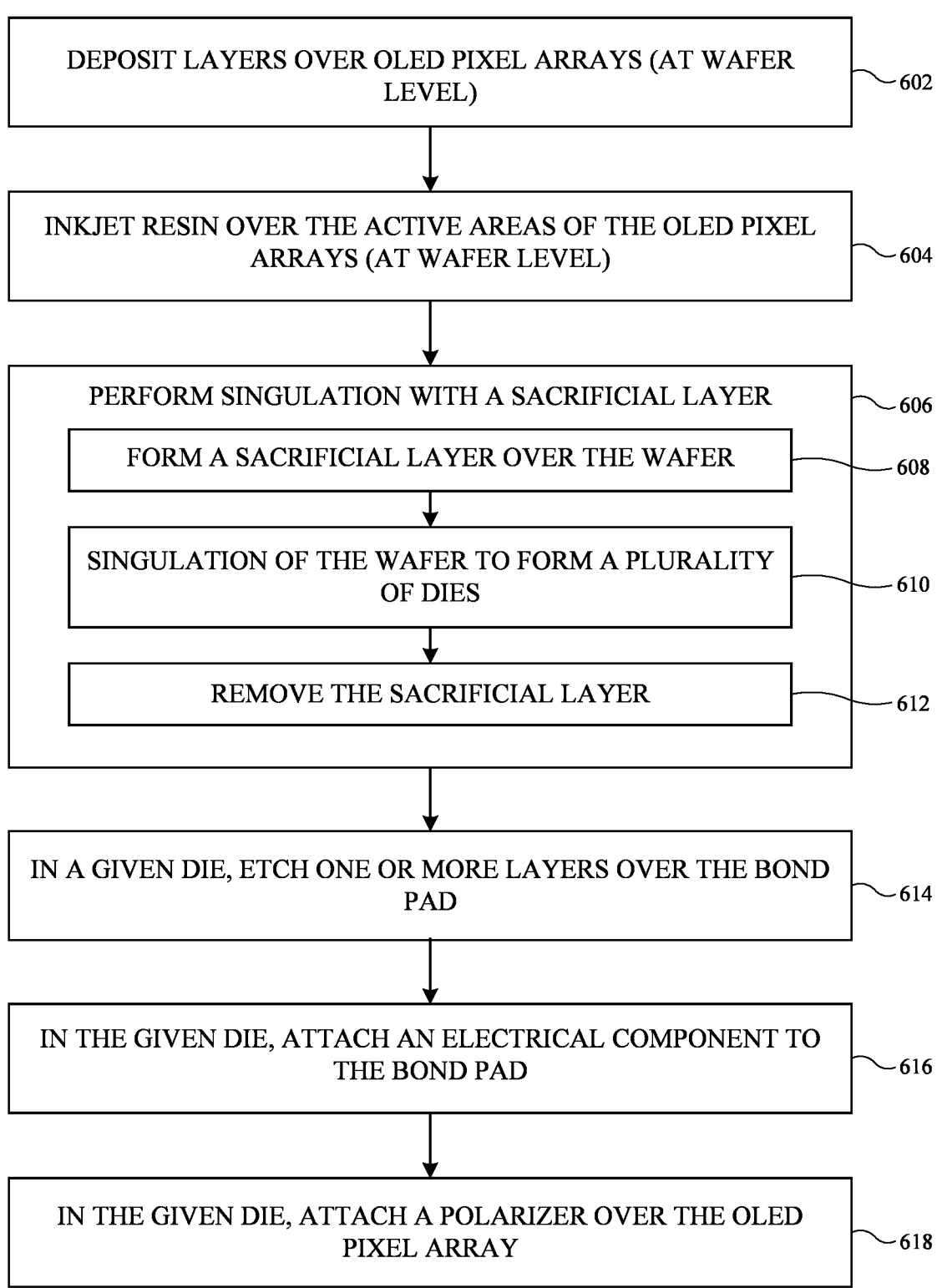

DEPOSIT LAYERS OVER OLED PIXEL ARRAYS (AT WAFER LEVEL) —602

INKJET RESIN OVER THE ACTIVE AREAS OF THE OLED PIXEL ARRAYS (AT WAFER LEVEL) —604

PERFORM SINGULATION WITH A SACRIFICIAL LAYER —606

FORM A SACRIFICIAL LAYER OVER THE WAFER —608

SINGULATION OF THE WAFER TO FORM A PLURALITY OF DIES —610

REMOVE THE SACRIFICIAL LAYER —612

IN A GIVEN DIE, ETCH ONE OR MORE LAYERS OVER THE BOND PAD —614

IN THE GIVEN DIE, ATTACH AN ELECTRICAL COMPONENT TO THE BOND PAD —616

IN THE GIVEN DIE, ATTACH A POLARIZER OVER THE OLED PIXEL ARRAY —618

FIG. 6

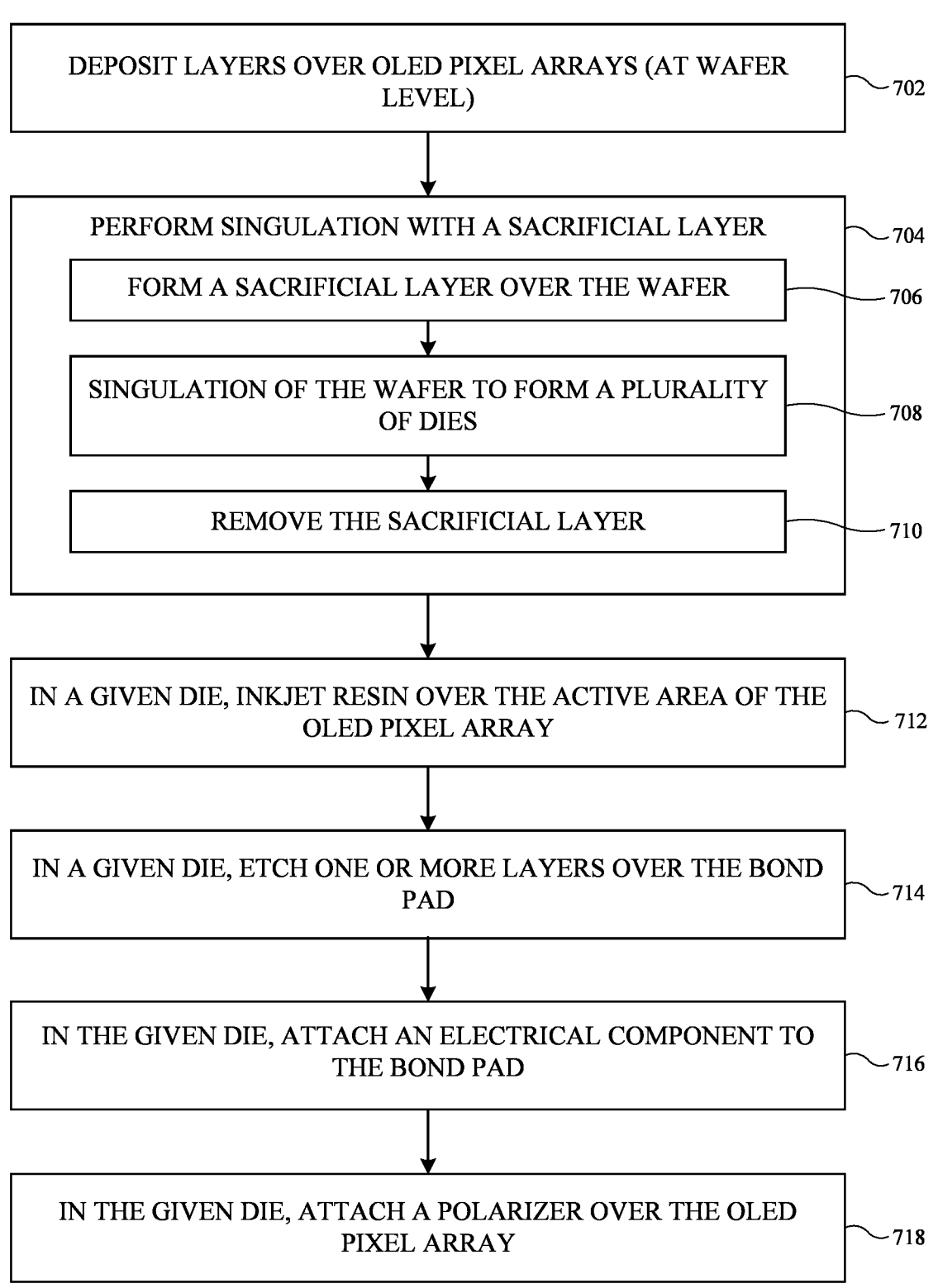

DEPOSIT LAYERS OVER OLED PIXEL ARRAYS (AT WAFER LEVEL) — 702

PERFORM SINGULATION WITH A SACRIFICIAL LAYER — 704

FORM A SACRIFICIAL LAYER OVER THE WAFER — 706

SINGULATION OF THE WAFER TO FORM A PLURALITY OF DIES — 708

REMOVE THE SACRIFICIAL LAYER — 710

IN A GIVEN DIE, INKJET RESIN OVER THE ACTIVE AREA OF THE OLED PIXEL ARRAY — 712

IN A GIVEN DIE, ETCH ONE OR MORE LAYERS OVER THE BOND PAD — 714

IN THE GIVEN DIE, ATTACH AN ELECTRICAL COMPONENT TO THE BOND PAD — 716

IN THE GIVEN DIE, ATTACH A POLARIZER OVER THE OLED PIXEL ARRAY — 718

*FIG. 7*

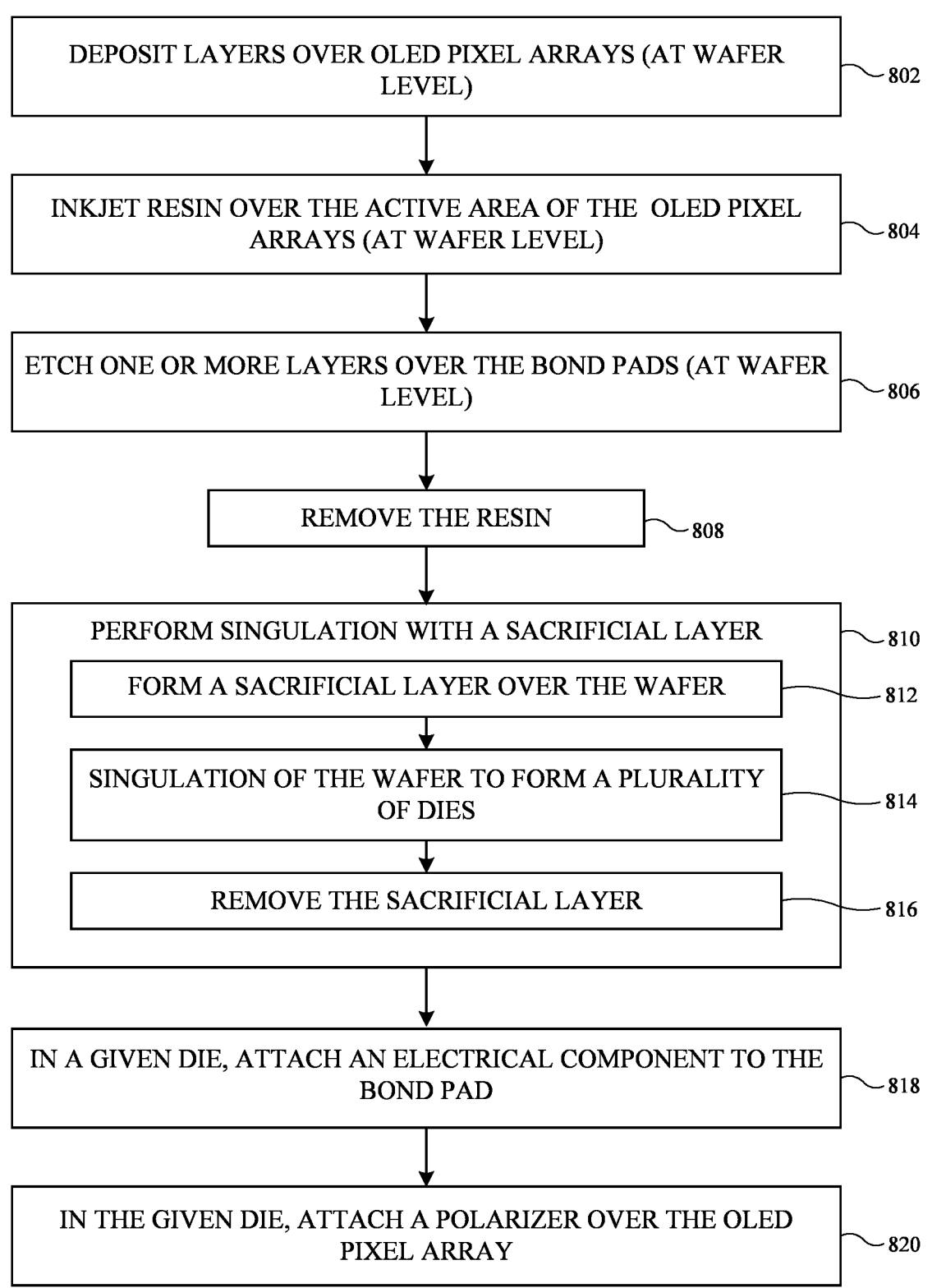

DEPOSIT LAYERS OVER OLED PIXEL ARRAYS (AT WAFER LEVEL) ~ 802

INKJET RESIN OVER THE ACTIVE AREA OF THE OLED PIXEL ARRAYS (AT WAFER LEVEL) ~ 804

ETCH ONE OR MORE LAYERS OVER THE BOND PADS (AT WAFER LEVEL) ~ 806

REMOVE THE RESIN ~ 808

PERFORM SINGULATION WITH A SACRIFICIAL LAYER ~ 810

FORM A SACRIFICIAL LAYER OVER THE WAFER ~ 812

SINGULATION OF THE WAFER TO FORM A PLURALITY OF DIES ~ 814

REMOVE THE SACRIFICIAL LAYER ~ 816

IN A GIVEN DIE, ATTACH AN ELECTRICAL COMPONENT TO THE BOND PAD ~ 818

IN THE GIVEN DIE, ATTACH A POLARIZER OVER THE OLED PIXEL ARRAY ~ 820

*FIG. 8*

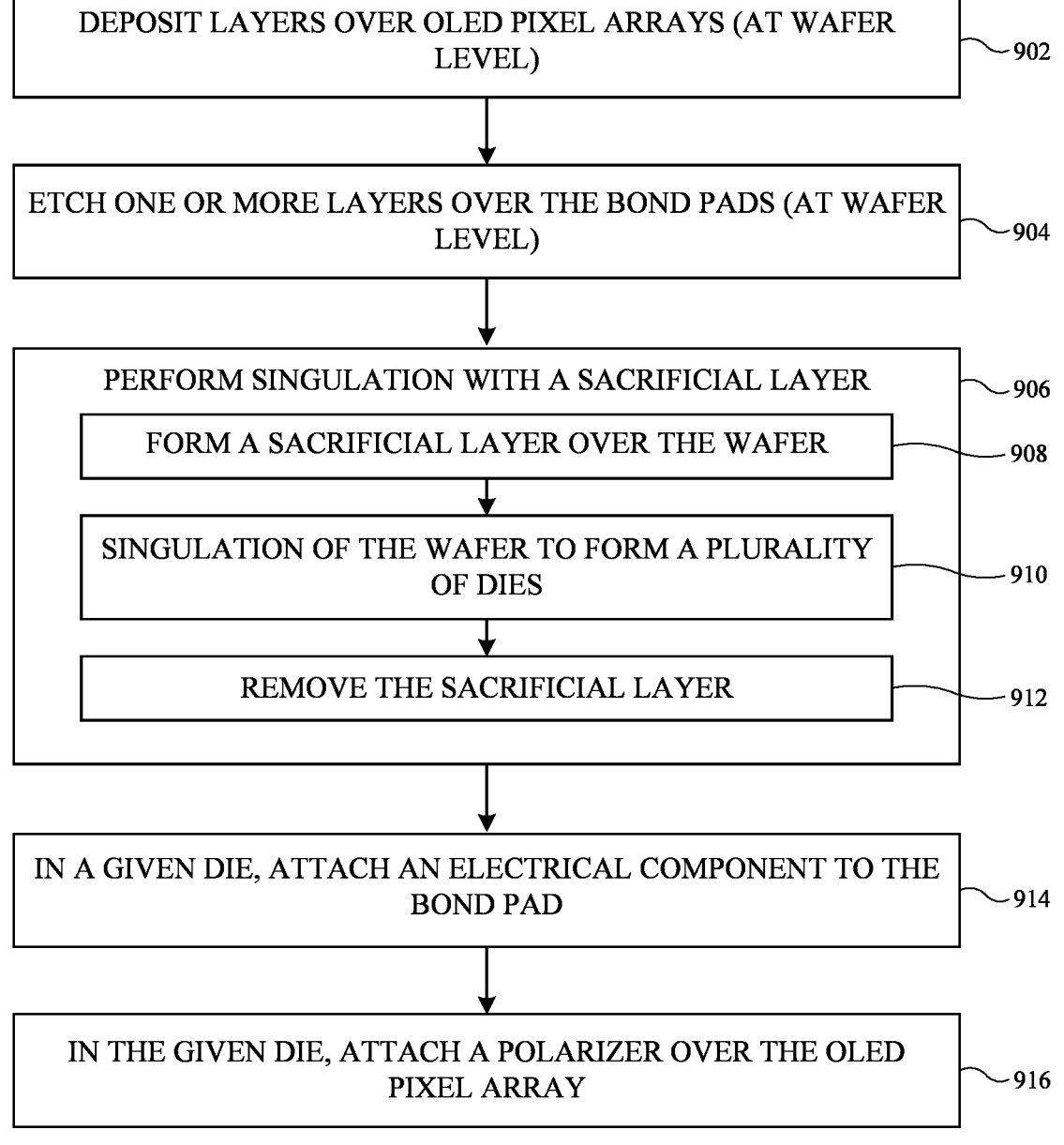

DEPOSIT LAYERS OVER OLED PIXEL ARRAYS (AT WAFER LEVEL) ~902

ETCH ONE OR MORE LAYERS OVER THE BOND PADS (AT WAFER LEVEL) ~904

PERFORM SINGULATION WITH A SACRIFICIAL LAYER ~906

FORM A SACRIFICIAL LAYER OVER THE WAFER ~908

SINGULATION OF THE WAFER TO FORM A PLURALITY OF DIES ~910

REMOVE THE SACRIFICIAL LAYER ~912

IN A GIVEN DIE, ATTACH AN ELECTRICAL COMPONENT TO THE BOND PAD ~914

IN THE GIVEN DIE, ATTACH A POLARIZER OVER THE OLED PIXEL ARRAY ~916

*FIG. 9*

MANUFACTURING DISPLAYS WITH AN ENCAPSULATION LAYER

This application claims priority to U.S. provisional patent application No. 63/403,448, filed Sep. 2, 2022, which is hereby incorporated by reference herein in its entirety.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels. In this type of display, each pixel includes a light-emitting diode and thin-film transistors for controlling application of a signal to the light-emitting diode to produce light. The light-emitting diodes may include OLED layers positioned between an anode and a cathode.

SUMMARY

A display may include a substrate, an array of pixels formed on the substrate, at least one encapsulation layer that is formed over the array of pixels, a color filter layer that is formed over the at least one encapsulation layer, and an additional encapsulation layer that is formed on the color filter layer, wherein the additional encapsulation layer comprises an inorganic material. In this type of display, an encapsulation glass may be omitted, and a polarizer may be formed directly over the additional encapsulation layer.

A method may include forming at least one layer over a wafer that includes a plurality of dies, wherein each die has a respective pixel array for a respective display and a respective bond pad region and wherein the at least one layer covers both the pixel arrays and the bond pad regions, forming a resin layer over the pixel arrays (but not the bond pad regions) using inkjet printing, performing singulation of the wafer to separate the plurality of dies, and etching a portion of the at least one layer that covers the bond pad regions.

A method may include forming at least one layer over a wafer that includes a plurality of dies, wherein each die has a respective pixel array for a respective display and a respective bond pad region and wherein the at least one layer covers both the pixel arrays and the bond pad regions, forming a photoresist layer over the pixel arrays (but not the bond pad regions) or laminating a UV sensitive protective layer over the pixel arrays (but not the bond pad regions), etching a portion of the at least one layer that covers the bond pad regions, and performing singulation of the wafer to separate the plurality of dies.

A method may include forming an array of light-emitting diode pixels on a substrate, forming at least one encapsulation layer over the array of light-emitting diode pixels, forming a color filter layer over the at least one encapsulation layer, and forming an encapsulation layer over the color filter layer using chemical vapor deposition.

BRIEF DESCRIPTION OF THE DRAWINGS

FIG. 6 is a flowchart of illustrative method steps for forming a display that includes inkjet printing a resin layer at the wafer level in accordance with some embodiments.

FIG. 7 is a flowchart of illustrative method steps for forming a display that includes inkjet printing a resin layer at the die level in accordance with some embodiments.

FIG. 8 is a flowchart of illustrative method steps for forming a display that includes inkjet printing and subsequently removing a resin layer in accordance with some embodiments.

FIG. 9 is a flowchart of illustrative method steps for forming a display that includes performing singulation with a sacrificial layer in accordance with some embodiments.

DETAILED DESCRIPTION

Figure 1:
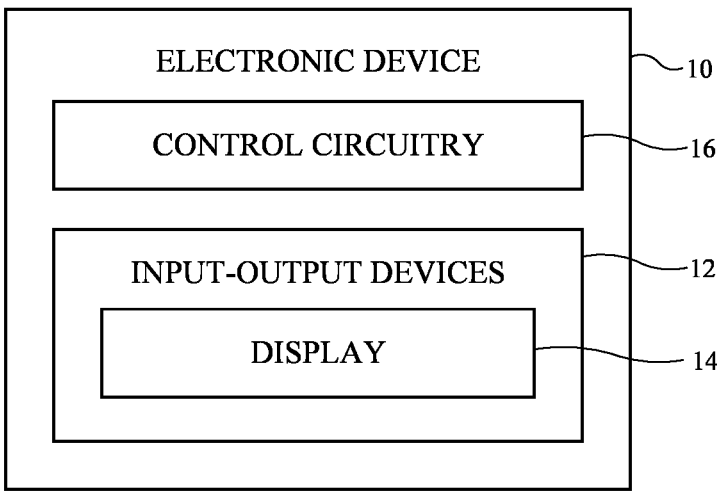
FIG. 1 is a schematic diagram of an illustrative electronic device having a display in accordance with some embodiments.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. The control circuitry may include storage such as hard disk drive storage, nonvolatile memory (e.g., flash memory or other electrically-programmable-read-only memory configured to form a solid-state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, keypads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a liquid crystal display, an organic light-emitting diode display, or any other desired type of display. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Figure 2:
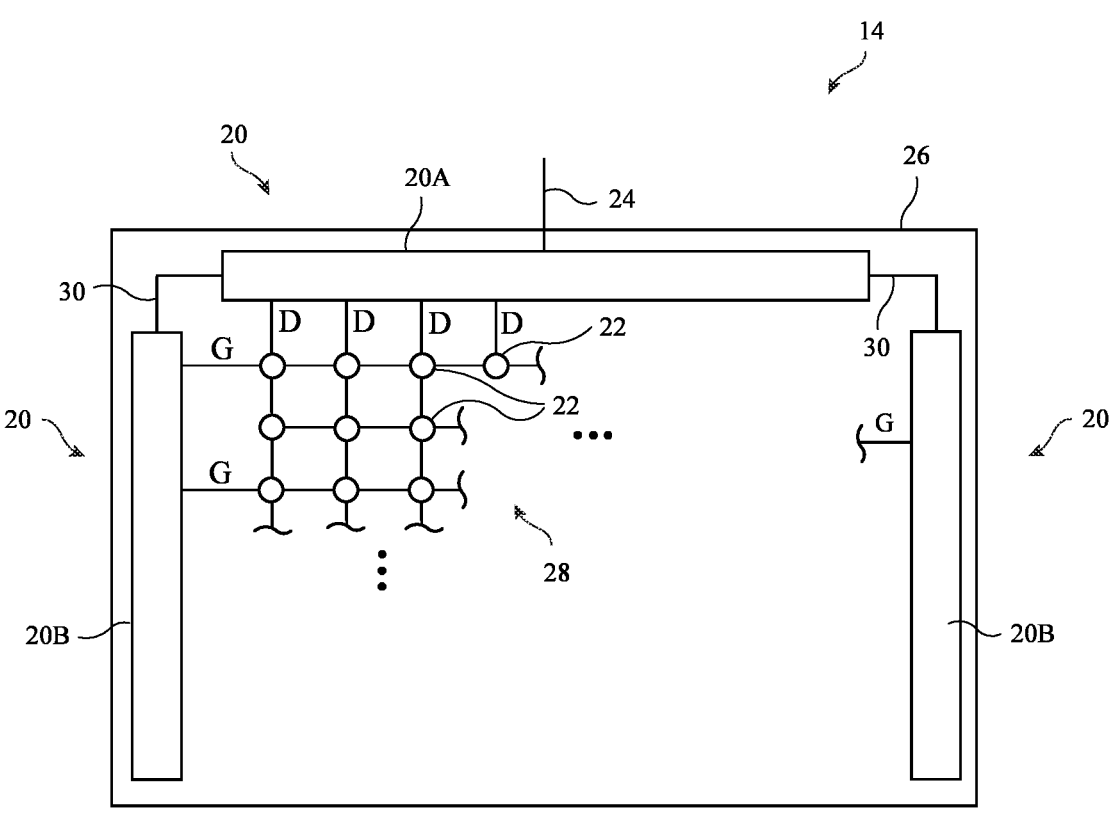
FIG. 2 is a schematic diagram of an illustrative display in accordance with some embodiments.

FIG. 2 is a diagram of an illustrative display. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, silicon layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels.

Display driver circuitry 20 may be used to control the operation of pixels 28. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 as shown in FIG. 2.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located at both the top and bottom of display 14 or in other portions of device 10.

To display the images on pixels 22, display driver circuitry 20A may supply corresponding image data to data lines D while issuing control signals to supporting display driver circuitry such as gate driver circuitry 20B over signal paths 30. With the illustrative arrangement of FIG. 2, data lines D run vertically through display 14 and are associated with respective columns of pixels 22.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally through display 14. Each gate line G is associated with a respective row of pixels 22. If desired, there may be multiple horizontal control lines such as gate lines G associated with each row of pixels. Individually controlled and/or global signal paths in display 14 may also be used to distribute other signals (e.g., power supply signals, etc.).

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Gate driver circuitry 20B may include blocks of gate driver circuitry such as gate driver row blocks. Each gate driver row block may include circuitry such output buffers and other output driver circuitry, register circuits (e.g., registers that can be chained together to form a shift register), and signal lines, power lines, and other interconnects. Each gate driver row block may supply one or more gate signals to one or more respective gate lines in a corresponding row of the pixels of the array of pixels in the active area of display 14.

Figure 3:
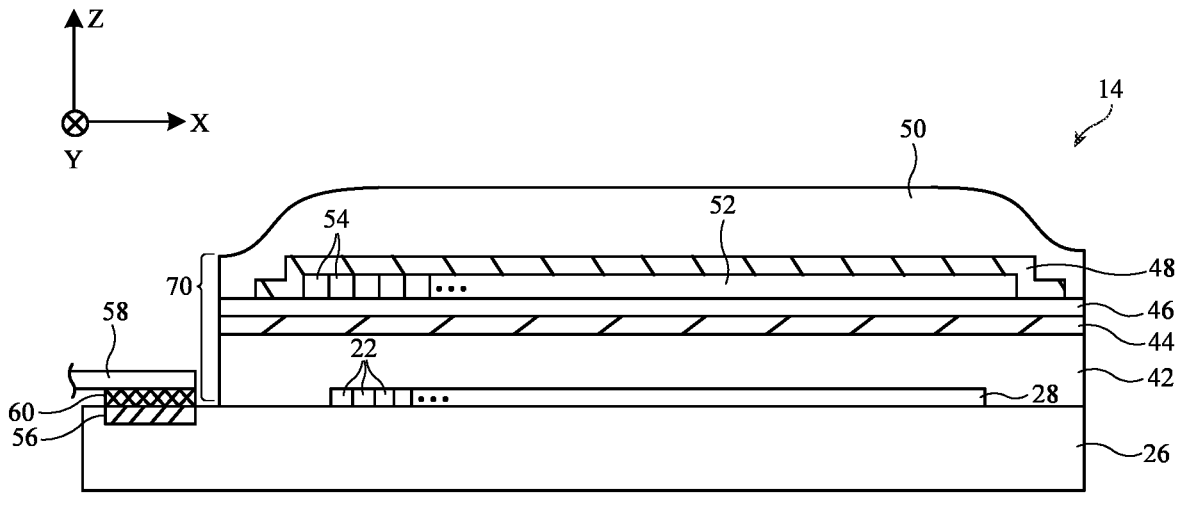
FIG. 3 is a cross-sectional side view of an illustrative display with an encapsulation layer over a color filter layer in accordance with some embodiments

FIG. 3 is a cross-sectional side view of an illustrative display 14. As shown in FIG. 3, display 14 may include a pixel array 28 formed on substrate 26. Substrate 26 may include thin-film transistor circuitry for operating pixels 22 in pixel array 28. Substrate 26 may sometimes be referred to as a backplane. Substrate 26 may include one or more glass layers, polymer layers, silicon layers, composite films that include polymer and inorganic materials, metallic foils, etc.

Pixels 22 in FIG. 3 may be discrete inorganic light-emitting diodes (sometimes referred to as microLEDs or microLED pixels), organic light-emitting diodes (e.g., with organic light-emitting diode layers interposed between an anode and a cathode) or any other desired type of pixels. In one example, pixels 22 may include pixels of different colors such as red pixels, blue pixels, and green pixels. In another example, pixels 22 may all emit a uniform color of light such as white light.

Pixel array 28 may be covered by one or more layers 70 (sometimes referred to as encapsulation layers 70, overlapping layers 70, etc.). In particular, an encapsulation layer 42 may be formed over pixel array 28. Encapsulation layer 42 may be formed from an inorganic dielectric material (e.g., silicon nitride, silicon dioxide, silicon oxynitride, etc.) or another desired material. Encapsulation layer 42 may be formed using chemical vapor deposition (CVD) or another desired technique. During chemical vapor deposition, substances in a vapor phase (e.g., under a vacuum) are condensed to generate solid phase material. Encapsulation layer 42 (sometimes referred to as CVD layer 42) may have a maximum thickness of 1 micron or another desired maximum thickness (e.g., greater than 1 micron, less than 1 micron, greater than 5 microns, less than 0.5 microns, between 0.5 microns and 3 microns, etc.).

Additional encapsulation layers 44 and 46 are formed over encapsulation layer 42. Encapsulation layers 44 and 46 may each be formed from an inorganic material (e.g., aluminum oxide, titanium oxide, zirconium dioxide, silicon nitride, silicon dioxide, etc.) or another desired material. Each one of encapsulation layers 44 and 46 may be formed using atomic layer deposition (ALD). Atomic layer deposition is a vapor phase technique in which a thin film is deposited through repeated exposure to separate precursors. Each one of encapsulation layers 44 and 46 (sometimes referred to as ALD layers 44 and 46) may have a thickness that is less than 500 nanometers, less than 100 nanometers, less than 50 nanometers, less than 5 nanometers, greater than 1 nanometer, greater than 5 nanometers, greater than 50 nanometers, greater than 100 nanometers, greater than 500 nanometers, etc.

In one illustrative arrangement, encapsulation layer 44 is an ALD layer formed from aluminum oxide and having a thickness between 40 nanometers and 60 nanometers and encapsulation layer 46 is an ALD layer formed from titanium oxide and having a thickness between 1 nanometer and 10 nanometers. In other words, layer 44 may be thicker than layer 46 (e.g., by at least 2×, at least 4×, at least 5×, at least 10×, etc.) and layer 42 may be thicker than layer 44 (e.g., by at least 2×, at least 4×, at least 5×, at least 10×, etc.).

A color filter layer 52 with a plurality of color filter elements 54 is formed on an upper surface of encapsulation layer 46. Color filter layer 52 may include red color filter elements (e.g., that pass red light and block blue and green light), green color filter elements (e.g., that pass green light and block blue and red light), and/or blue color filter elements (e.g., that pass blue light and block red and green light).

Color filter layer 52 may sometimes be part of one or more organic layers that are interposed between encapsulation layers 46 and 48. The color filter elements 54 may be formed from organic material. In one example, an overcoat layer (formed from organic material) may be formed over the color filter elements (e.g., between the color filter elements and the encapsulation layer 48). Instead or in addition, an undercoat layer (formed from organic material) may be formed under the color filter elements (e.g., between the color filter elements and the encapsulation layer 46).

In some arrangements, an encapsulation glass layer may be formed over the color filter layer 52 to prevent moisture ingress from the top of the display. However, using encapsulation glass may have a greater manufacturing cost and complexity than desired. Using encapsulation glass may also result in display 14 have a greater thickness than desired. Alternatively, as shown in FIG. 3, an encapsulation layer 48 (sometimes referred to as a conformal encapsulation layer 48) may be formed over color filter layer 52. The encapsulation layer 48 may conform to the upper surface and/or side surfaces of color filter layer 52 (and an optional undercoat and/or overcoat). Encapsulation layer 48 may be formed using CVD. Encapsulation layer 48 may optionally be formed from the same material as encapsulation layer 42 (which is also formed using CVD). Alternatively, encapsulation layer 48 may be formed using atomic layer deposition (ALD). In general, encapsulation layer 48 may be formed from an inorganic dielectric material (e.g., silicon nitride, silicon dioxide, silicon oxynitride, aluminum oxide, titanium oxide, zirconium dioxide, etc.) or another desired material.

Encapsulation layer 48 may have a thickness of greater than 5 nanometers, greater than 50 nanometers, greater than 100 nanometers, greater than 500 nanometers, greater than 1000 nanometers, greater than 2000 nanometers, less than 5 nanometers, less than 50 nanometers, less than 100 nanometers, less than 500 nanometers, less than 1000 nanometers, less than 2000 nanometers, etc. Encapsulation layer 48 may have a water vapor transmission rate (WVTR) of (in units of grams per square meter per day at 40 degrees Celsius and 90 percent relative humidity) $10^{-4}$, less than $10^{-3}$, less than $10^{-4}$, etc.

As shown in FIG. 3, a polarizer 50 (e.g., a linear polarizer) may be formed over encapsulation layer 48 if desired. The polarizer 50 may be formed over encapsulation layer 48 without an intervening glass layer. In some embodiments, a resin layer or additional protective layer may be interposed between encapsulation layer 48 and polarizer 50.

Encapsulation layer 48 in FIG. 3 conforms to and is in direct contact with color filter layer 52. The encapsulation layer may be in direct contact with both an upper surface and side surfaces of the color filter layer. Using encapsulation layer 48 as in FIG. 3 may reduce manufacturing cost and complexity while still maintaining satisfactory reliability (e.g., moisture blocking). Using encapsulation layer 48 as in FIG. 3 may advantageously reduce the overall thickness of display 14. The encapsulation layer 48 may prevent ingress of moisture from both the top of the display (e.g., in the negative Z-direction) and the sides of the display (e.g., in the positive X-direction from the left side of FIG. 3 and the negative X-direction from the right side of FIG. 3). Due to the effective moisture blocking provided by encapsulation layer 48, the display may have a narrow inactive border region (allowing for a greater number of dies to be produced from each wafer during manufacturing, further improving manufacturing cost and complexity).

FIG. 3 also shows how substrate 26 may include a conductive contact 56 for electrical connections to additional components within electronic device 10. In the example of FIG. 3, a flexible printed circuit 58 is attached to conductive contact 56 using a conductive structure 60 (e.g., solder, anisotropic film, etc.). Other components may be connected to contacts 56 on display 14 such as a display driver integrated circuit (DDIC), timing controller, etc.

Figure 4:
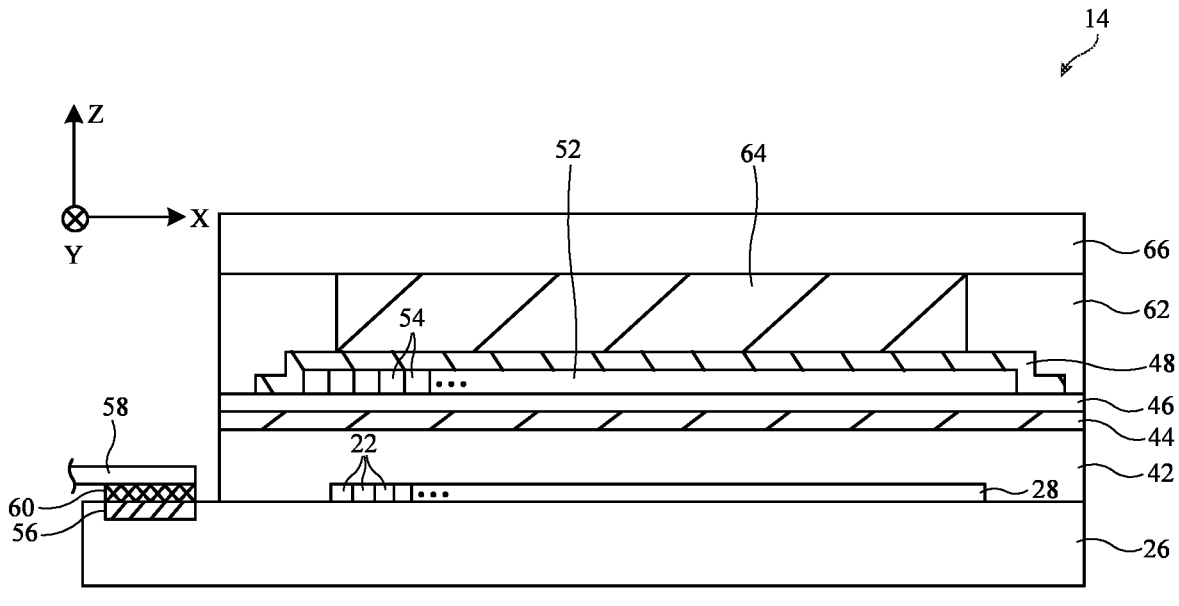
FIG. 4 is a cross-sectional side view of an illustrative display with an encapsulation layer and encapsulant glass over a color filter layer in accordance with some embodiments.

The example in FIG. 3 of a polarizer 50 being formed over encapsulation layer 48 is merely illustrative. In another possible arrangement, shown in FIG. 4, edge seal 62 (e.g., formed from glass or another desired material), resin 64, and encapsulant glass 66 may be formed over encapsulation layer 48. In the arrangement of FIG. 4, the effective moisture blocking provided by encapsulation layer 48 may allow the display to have a narrow inactive border region (allowing for a greater number of dies to be produced from each wafer during manufacturing, improving manufacturing cost and complexity).

Figure 5:
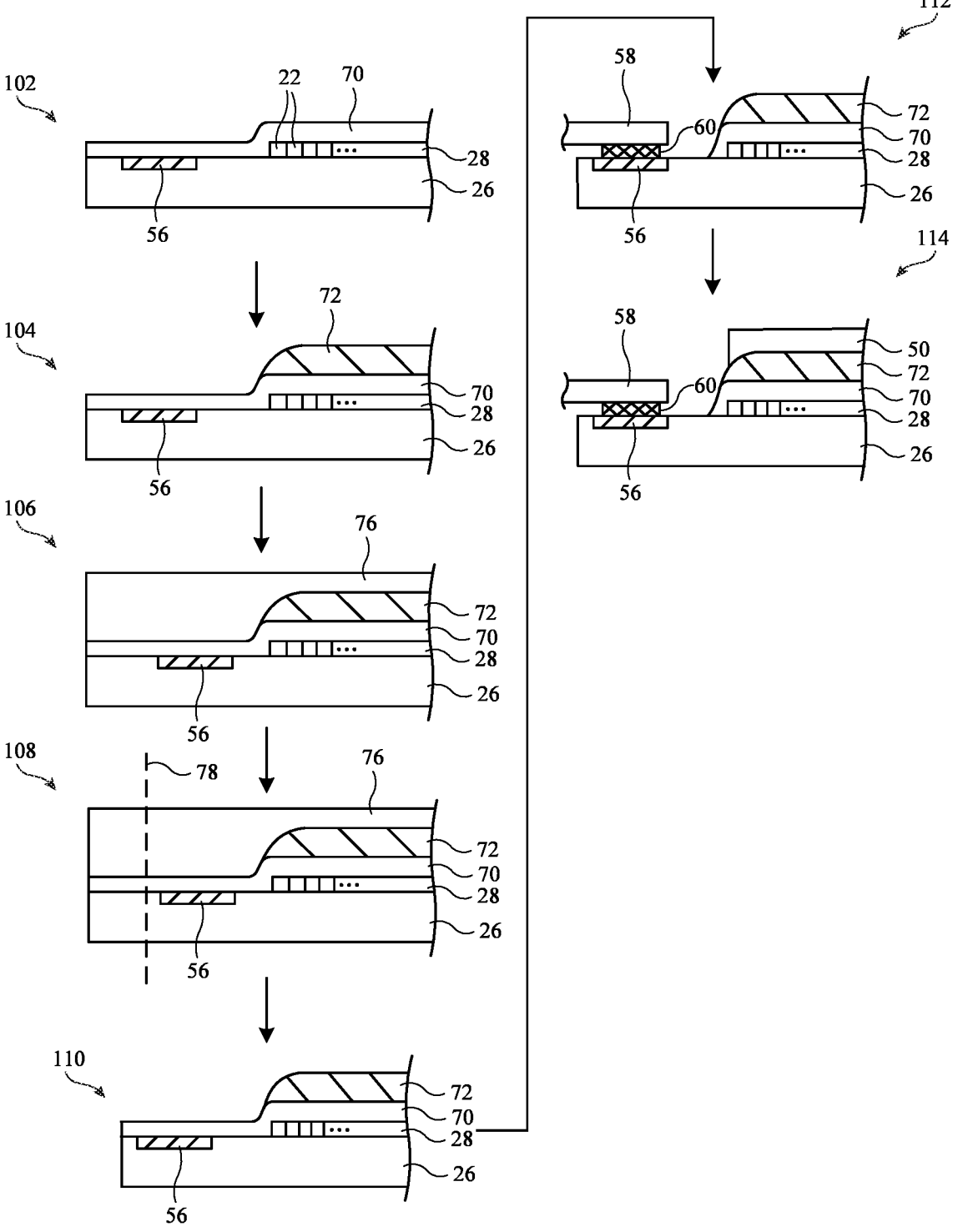
FIG. 5 is a flowchart showing cross-sectional side views of an illustrative display during various manufacturing steps in accordance with some embodiments.

FIG. 5 is a flowchart showing a cross-sectional side view of display 14 at various steps during manufacturing. At step 102, one or more layers 70 are formed over pixel array 28. Layers 70 may include encapsulation layers 42 (deposited using CVD), encapsulation layer 44 (deposited using ALD), encapsulation layer 46 (deposited using ALD), color filter array 52, and/or encapsulation layer 48 (deposited using CVD). At step 102, layers 70 are formed both over pixel array 28 and bond pad 56.

At step 104, a resin layer 72 may be formed over the pixel array 28 (and additional layers 70). Resin layer 72 may be formed using inkjet printing (IJP), as one example. Resin layer 72 may protect the underlying layers during manufacturing. Resin layer 72 has a footprint that overlaps pixel array 28 but not bond pad 56. Resin layer 72 may be formed from any desired material. Resin layer 72 may have a high transparency (e.g., greater than 80%, greater than 90%, greater than 95%, greater than 99%, etc.).

At step 106, a sacrificial layer 76 may be formed over both pixel array 28 and bond pad 56. The sacrificial layer 76 may be a protective layer that protects the display during subsequent singulation. During step 108, singulation occurs with a larger wafer being cut into a plurality of dies (e.g., a cut along dashed line 78 to create a display die) that each include a respective pixel array 28. At step 110, sacrificial layer 76 is stripped (removed).

At step 112, the portion of layers 70 over bond pad 56 is removed (e.g., via etching) and an electronic component such as flexible printed circuit 58 is electrically connected to the now exposed bond pad 56 (e.g., using conductive structure 60). Resin layer 72 may optionally form an etch stop layer during the etching of layers 70 over bond pad 56. Layers 70 are removed over bond pad 56 but not over pixel array 28. At step 114, polarizer 50 is added over resin layer 72 (e.g., coated to resin layer 72, attached to resin layer 72 using adhesive, etc.).

FIG. 6 is a flowchart of illustrative method steps for forming a display. The method steps of FIG. 6 may correspond to the cross-sectional side views shown in FIG. 5. At step 602, layers 70 may be deposited over a wafer with multiple pixel arrays. The layers 70 may be formed as blanket layers and/or may be patterned over the multiple pixel arrays. For each die in the wafer, one or more layers 70 may overlap a bond pad region of the die. As one example, during step 602 encapsulation layer 42 is deposited using CVD, encapsulation layer 44 is deposited using ALD, encapsulation layer 46 is deposited using ALD, color filter layer 52 is formed, and/or encapsulation layer 48 is deposited using CVD.

At step 604, resin may be formed over the active areas of the pixel arrays. The resin may be deposited at the wafer level using inkjet printing, as one example. The resin layer may be printed over the pixel arrays but not the bond pads (as shown in step 104 of FIG. 5).

At step 606, singulation of the wafer may be performed using a sacrificial layer. The singulation may include forming a sacrificial layer (e.g., sacrificial layer 76 from step 106 in FIG. 5) over the wafer at step 608, performing singulation of the wafer to form a plurality of dies at step 610, and removing the sacrificial layer at step 612.

The subsequent steps (e.g., steps 614, 616, and 618) may be performed for each singulated die. At step 614, the one or more layers 70 above bond pad 56 may be etched (e.g., using photolithography or other desired etching techniques) to expose the bond pad. At step 616, one or more electrical components may be attached to the one or more exposed bond pads. At step 618, a polarizer may be attached to the die over the pixel array.

The example of FIG. 6 is merely illustrative. In general, the order of steps presented in FIG. 6 may be modified as desired. Additionally, some steps may be added and/or omitted.

For example, in FIG. 6, the inkjet resin is formed at step 604 (before singulation of the wafer). Alternatively, the inkjet resin may be formed after singulation of the wafer. FIG. 7 is a flowchart of illustrative steps of this type. At step 702, layers 70 may be deposited over a wafer with multiple pixel arrays. The layers 70 may be formed as blanket layers and/or may be patterned over the multiple pixel arrays. For each die in the wafer, one or more layers 70 may overlap a bond pad region of the die. As one example, during step 702 encapsulation layer 42 is deposited using CVD, encapsulation layer 44 is deposited using ALD, encapsulation layer 46 is deposited using ALD, color filter layer 52 is formed, and/or encapsulation layer 48 is deposited using CVD.

At step 704, singulation of the wafer may be performed using a sacrificial layer. The singulation may include forming a sacrificial layer (e.g., sacrificial layer 76 from step 106 in FIG. 5) over the wafer at step 706, performing singulation of the wafer to form a plurality of dies at step 708, and removing the sacrificial layer at step 710.

The subsequent steps (e.g., steps 712, 714, 716, and 718) may be performed for each singulated die. At step 712, the resin is formed over the active area of the OLED pixel array (e.g., using inkjet printing). The resin may cover the OLED pixel array without covering a bond pad region of the die. At step 714, the one or more layers 70 above the bond pad may be etched (e.g., using photolithography or other desired etching techniques) to expose the bond pad. At step 716, one or more electrical components may be attached to the one or more exposed bond pads. At step 718, a polarizer may be attached to the die over the pixel array.

In FIGS. 6 and 7, the resin deposited via inkjet printing remains in the final display 14 that is used in electronic device 10. In other words, as shown in FIG. 5, resin 72 is included between layers 70 and polarizer 50 in the final display 14 of electronic device 10. This example is merely illustrative. In an alternate method, shown in FIG. 8, the resin is removed after the etching of the layers over the bond pad regions.

Moreover, the example in FIGS. 6 and 7 of etching the one or more layers over the bond pad after singulation is merely illustrative. If desired, etching the one or more layers over the bond pad may be performed before singulation. FIG. 8 shows an example of this type.

FIG. 8 is a flowchart of illustrative steps for forming a display. At step 802, layers 70 may be deposited over a wafer with multiple pixel arrays. The layers 70 may be formed as blanket layers and/or may be patterned over the multiple pixel arrays. For each die in the wafer, one or more layers 70 may overlap a bond pad region of the die. As one example, during step 802 encapsulation layer 42 is deposited using CVD, encapsulation layer 44 is deposited using ALD, encapsulation layer 46 is deposited using ALD, color filter layer 52 is formed, and/or encapsulation layer 48 is deposited using CVD.

At step 804, resin may be formed over the active areas of the pixel arrays. The resin may be deposited at the wafer level using inkjet printing, as one example. The resin layer may be printed over the pixel arrays but not the bond pads (as shown in step 104 of FIG. 5).

At step 806, the one or more layers 70 above the bond pads in the wafer may be etched (e.g., using photolithography or other desired etching techniques) to expose the bond pads. After etching is complete, the resin layer may be removed at step 808. When the resin layer is removed in this manner, the resin layer may be opaque if desired (e.g., the resin layer may have a transparency of less than 80%, less than 50%, less than 20%, etc.).

At step 810, singulation of the wafer may be performed using a sacrificial layer. The singulation may include forming a sacrificial layer (e.g., sacrificial layer 76 from step 106 in FIG. 5) over the wafer at step 812, performing singulation of the wafer to form a plurality of dies at step 814, and removing the sacrificial layer at step 816.

The subsequent steps (e.g., steps 818 and 820) may be performed for each singulated die. At step 818, one or more electrical components may be attached to the one or more exposed bond pads. At step 820, a polarizer may be attached to the die over the pixel array. Using the method of FIG. 8, the polarizer is formed directly on an uppermost one of layers 70 (e.g., encapsulation layer 48) in display 14 (as in FIG. 3, for example) without an intervening resin layer.

In yet another possible method for forming a display, the inkjet printing of resin layer 72 (as in step 104 of FIG. 5) may be omitted. FIG. 9 is a flowchart of an illustrative method of this type.

At step 902, layers 70 may be deposited over a wafer with multiple pixel arrays. The layers 70 may be formed as blanket layers and/or may be patterned over the multiple pixel arrays. For each die in the wafer, one or more layers 70 may overlap a bond pad region of the die. As one example, during step 902 encapsulation layer 42 is deposited using CVD, encapsulation layer 44 is deposited using ALD, encapsulation layer 46 is deposited using ALD, color filter layer 52 is formed, and/or encapsulation layer 48 is deposited using CVD.

At step 904, the one or more layers 70 above the bond pads in the wafer may be etched to expose the bond pads. As one example, lithography may be used to etch the one or more layers 70 over the bond pads. During the lithography process, a photoresist (sometimes referred to as a protective layer) may be formed over the pixel arrays and the exposed portions of the one or more layers 70 over the bond pad regions may be etched, thus exposing the bond pad regions. Alternatively, a protective layer (e.g., an ultraviolet-light-sensitive protective layer) may be laminated over the pixel arrays. The exposed portions of the one or more layers (over the bond pad regions) may then be etched to expose the bond pad regions. The protective layer used during etching may be removed after etching or may remain in the display. At step 906, singulation of the wafer may be performed using a sacrificial layer. The singulation may include forming a sacrificial layer (e.g., sacrificial layer 76 from step 106 in FIG. 5) over the wafer at step 908, performing singulation of the wafer to form a plurality of dies at step 910, and removing the sacrificial layer at step 912.

The subsequent steps (e.g., steps 914 and 916) may be performed for each singulated die. At step 916, one or more electrical components may be attached to the one or more exposed bond pads. At step 918, a polarizer may be attached to the die over the pixel array. Using the method of FIG. 9, the polarizer may be formed directly on an uppermost one of layers 70 (e.g., encapsulation layer 48) in display 14 (as in FIG. 3, for example) without an intervening resin layer or may be formed directly on a protective layer such as an ultraviolet-light-sensitive protective layer.

It is noted that encapsulation layers 42, 44, and 46 as well as encapsulation layer 48 may each have a transparency that is greater than 80%, greater than 90%, greater than 95%, greater than 98%, etc.

The foregoing is merely illustrative and various modifications can be made by those skilled in the art without departing from the scope and spirit of the described embodiments. The foregoing embodiments may be implemented individually or in any combination.

What is claimed is:

1. A display comprising:
a substrate;
an array of pixels formed on the substrate;
at least one encapsulation layer that is formed over the array of pixels;
at least one organic layer that is formed over the at least one encapsulation layer, wherein the at least one organic layer comprises a color filter layer;
an additional encapsulation layer that is formed on the at least one organic layer, wherein the additional encapsulation layer comprises an inorganic material;
a resin layer formed on the additional encapsulation layer; and
a polarizer formed on the resin layer, wherein the resin layer is interposed between the array of pixels and the polarizer.

2. The display defined in claim 1, wherein the inorganic material comprises silicon nitride.

3. The display defined in claim 1, wherein the inorganic material comprises silicon dioxide.

4. The display defined in claim 1, wherein the inorganic material comprises a material selected from the group consisting of: silicon nitride, silicon dioxide, silicon oxynitride, aluminum oxide, zirconium dioxide, and titanium oxide.

5. The display defined in claim 1, wherein the additional encapsulation layer is formed in direct contact with an upper surface of the at least one organic layer.

6. The display defined in claim 5, wherein the additional encapsulation layer is formed in direct contact with side surfaces of the at least one organic layer.

7. The display defined in claim 1, wherein the at least one encapsulation layer includes a first encapsulation layer that is also formed from the inorganic material.

8. The display defined in claim 7, wherein the at least one encapsulation layer includes a second encapsulation layer that is interposed between the first encapsulation layer and the color filter layer and wherein the second encapsulation layer is formed from a different material than the first encapsulation layer.

9. The display defined in claim 8, wherein the at least one encapsulation layer includes a third encapsulation layer that is interposed between the second encapsulation layer and the color filter layer and wherein the third encapsulation layer is formed from a different material than the first and second encapsulation layers.

10. The display defined in claim 9, wherein the first encapsulation layer is formed from silicon nitride, wherein the second encapsulation layer is formed from aluminum oxide, and wherein the third encapsulation layer is formed from titanium oxide.

11. The display defined in claim 10, wherein the first encapsulation layer has a first thickness, wherein the second encapsulation layer has a second thickness, wherein the third encapsulation layer has a third thickness, wherein the second thickness is at least five times greater than the third thickness, and wherein the first thickness is at least five times greater than the second thickness.

12. The display defined in claim 1, further comprising:
a bond pad at an edge of the substrate, wherein the bond pad is not overlapped by the at least one encapsulation layer and the additional encapsulation layer.

13. The display defined in claim 1, wherein the at least one organic layer comprises an undercoat layer that is interposed between the color filter layer and the at least one encapsulation layer.

14. The display defined in claim 1, wherein the at least one organic layer comprises an overcoat layer that is interposed between the color filter layer and the additional encapsulation layer.

15. The display defined in claim 1, wherein the at least one encapsulation layer includes a first encapsulation layer that is formed from a different material than the inorganic material.

16. The display defined in claim 1, further comprising:
a protective layer formed on the resin layer.

17. The display defined in claim 16, wherein the protective layer is an ultraviolet-light-sensitive protective layer.

18. The display defined in claim 1, further comprising:
a bond pad at an edge of the substrate, wherein the array of pixels emits light in a direction, wherein the resin layer overlaps the array of pixels in the direction, and wherein the bond pad is not overlapped by the resin layer in the direction.

19. A display comprising:
a substrate;
an array of pixels formed on the substrate;
a first inorganic encapsulation layer formed over the array of pixels;
a second inorganic encapsulation layer formed over the array of pixels;
a third inorganic encapsulation layer formed over the array of pixels, wherein the second inorganic encapsulation layer is interposed between the first inorganic encapsulation layer and the third inorganic encapsulation layer; and
a color filter layer that is formed over the array of pixels, wherein the third inorganic encapsulation layer is interposed between the second inorganic encapsulation layer and the color filter layer.

20. The display defined in claim 19, wherein the third inorganic encapsulation layer is formed from titanium oxide.

21. The display defined in claim 20, wherein the first inorganic encapsulation layer is formed from silicon nitride and wherein the second inorganic encapsulation layer is formed from aluminum oxide.

22. The display defined in claim 19, wherein the color filter layer comprises an organic layer.

23. A display comprising:
a substrate;
an array of pixels formed on the substrate;
a first encapsulation layer formed over the array of pixels and having a first thickness;
a second encapsulation layer formed over the array of pixels and having a second thickness, wherein the first thickness is at least five times greater than the second thickness;
a third encapsulation layer formed over the array of pixels and having a third thickness, wherein the second encapsulation layer is interposed between the first encapsulation layer and the third encapsulation layer and wherein the second thickness is at least five times greater than the third thickness; and
an organic layer formed over the third encapsulation layer, wherein the third encapsulation layer is interposed between the second encapsulation layer and the organic layer.

24. The display defined in claim 23, wherein the organic layer comprises color filter elements.

25. A display comprising:
a substrate;
an array of pixels formed on the substrate;
at least one encapsulation layer that is formed over the array of pixels;
at least one organic layer that is formed over the at least one encapsulation layer, wherein the at least one organic layer comprises a color filter layer;
an additional encapsulation layer that is formed on the at least one organic layer, wherein the additional encapsulation layer comprises an inorganic material;
a protective layer formed on the additional encapsulation layer; and
a polarizer formed on the protective layer, wherein the protective layer is interposed between the array of pixels and the polarizer.

26. The display defined in claim 25, wherein the protective layer is an ultraviolet-light-sensitive protective layer.

27. The display defined in claim 25, wherein the protective layer is a photoresist.

28. A display comprising:
a substrate;
an array of pixels formed on the substrate;
a first encapsulation layer formed over the array of pixels;
a second encapsulation layer formed over the array of pixels;
a third encapsulation layer formed over the array of pixels, wherein the second encapsulation layer is interposed between the first encapsulation layer and the third encapsulation layer;
an organic layer formed over the third encapsulation layer, wherein the third encapsulation layer is interposed between the second encapsulation layer and the organic layer;
a resin layer formed over the organic layer, wherein the organic layer is interposed between the third encapsulation layer and the resin layer; and
encapsulant glass formed over the resin layer, wherein the resin layer is interposed between the organic layer and the encapsulant glass.

29. The display defined in claim 28, further comprising:
an edge seal interposed between the organic layer and the encapsulant glass.

30. The display defined in claim 29, wherein the edge seal comprises glass.

31. The display defined in claim 28, further comprising:
a fourth encapsulation layer formed over the organic layer, wherein the fourth encapsulation layer is interposed between the organic layer and the resin layer.

* * * * *